United States Patent
Sumida

[19]

[11] Patent Number: 6,108,202
[45] Date of Patent: *Aug. 22, 2000

[54] ELECTRIC CONNECTION BOX

[75] Inventor: Tatsuya Sumida, Yokkaichi, Japan

[73] Assignee: Sumitomo Wiring Systems, Ltd., Mie, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/887,333

[22] Filed: Jul. 2, 1997

[30] Foreign Application Priority Data

Jul. 3, 1996 [JP] Japan .................................. 8-173511

[51] Int. Cl.[7] ................................................. H05K 7/20
[52] U.S. Cl. ............................................................ 361/690
[58] Field of Search .................................. 361/690, 694, 361/695; 439/485

[56] References Cited

U.S. PATENT DOCUMENTS

| | | | |
|---|---|---|---|
| 3,305,704 | 2/1967 | Battista | 361/383 |
| 3,434,014 | 3/1969 | Taynton | 361/383 |
| 4,502,098 | 2/1985 | Brown et al. | 361/383 |
| 4,864,080 | 9/1989 | Fochler et al. | 285/154.2 |
| 4,940,419 | 7/1990 | Kurita et al. | 439/271 |
| 4,950,168 | 8/1990 | Watanabe et al. | 439/34 |
| 4,972,295 | 11/1990 | Suguro et al. | 361/386 |
| 5,014,909 | 5/1991 | Yasuo | 361/697 |
| 5,048,372 | 9/1991 | Sodeno et al. | 74/860 |
| 5,051,867 | 9/1991 | Burgher et al. | 361/383 |
| 5,067,040 | 11/1991 | Fallik | 361/384 |
| 5,154,151 | 10/1992 | Bradshaw et al. | 123/481 |
| 5,177,447 | 1/1993 | Marino et al. | 324/713 |
| 5,220,484 | 6/1993 | Seri | 361/383 |
| 5,258,888 | 11/1993 | Korinsky | 361/704 |
| 5,282,114 | 1/1994 | Stone | 361/687 |
| 5,315,252 | 5/1994 | Puetz et al. | 324/402 |
| 5,343,029 | 8/1994 | Katoh et al. | 235/467 |
| 5,422,787 | 6/1995 | Gourdine | 361/697 |
| 5,473,507 | 12/1995 | Schwegler | 361/690 |
| 5,484,012 | 1/1996 | Hiratsuka | 165/40 |
| 5,493,457 | 2/1996 | Kawamura et al. | 369/75.1 |
| 5,531,345 | 7/1996 | Nakamura et al. | 220/3.8 |
| 5,532,431 | 7/1996 | Saka et al. | 174/52.3 |
| 5,732,680 | 3/1998 | Ninomiya | 123/481 |
| 5,752,845 | 5/1998 | Fu | 439/247 |
| 5,758,931 | 6/1998 | Hio et al. | 303/119.2 |
| 5,773,755 | 6/1998 | Iwatare | 174/17 |
| 5,793,277 | 8/1998 | Ichikawa et al. | 338/22 |
| 5,816,850 | 10/1998 | Yamada et al. | 439/507 |
| 5,828,549 | 10/1998 | Gandre et al. | 361/695 |
| 5,856,909 | 1/1999 | Kamo et al. | 361/695 |

FOREIGN PATENT DOCUMENTS 3-57978 6/1991 Japan .

Primary Examiner—Kevin Hurley
Assistant Examiner—Andrew J. Fischer
Attorney, Agent, or Firm—Oliff & Berridge, PLC

[57] ABSTRACT

An electronic control circuit susceptible to heat damage is housed in a first compartment of a body of an electrical connection box. A relay box and a fusible link box which release heat are housed in a second compartment of the body. A cover for covering the body is similarly divided. Air is exhausted from the space through an intake pipe. Wire harnesses connected with the components are inserted through waterproof grommets. Heating of the electronic control unit by the engine and by the heat releasing components is minimized, and waterproofing is achieved.

14 Claims, 4 Drawing Sheets

ELECTRIC CONNECTION BOX

BACKGROUND OF THE INVENTION

1. Field of Invention

The present invention relates to an electrical connection box and more particularly to an electrical connection box installed in the engine compartment of an automotive vehicle.

2. Description of Related Art

Various types of electrical connection boxes for various kinds of electrical devices, such as a junction box, a relay box, a fusible link box, and an electronic control unit for use in a car are known. When using these boxes it is necessary to avoid or minimize water leaking into the electrical connection box in order to keep the electronic components dry. In order to waterproof the electrical connection box a sealing packing is installed at a mating surface of the body and the cover of the electrical connection box to seal the box. This sealing is usually made of synthetic resin.

Relays and fuses are heat generating components. Thus, heat released from these components is retained in the sealed electrical connection box which raises the temperature within the box. Additionally, when the electrical connection box is placed in the engine compartment, the temperature inside the box is also raised due to the heat of the engine.

Electronic control units are increasingly used in cars. A typical electronic control unit (ECU) consists of an electronic circuit comprising heat-susceptible electronic components. When the environmental temperature increases the ECU, the characteristics of the electronic circuit may change thus decreasing the reliability of the ECU. In order to improve the heat resistance of the electronic circuit, it is necessary to use expensive heat-resistance electronic parts. These parts increase the entire cost of the car.

Because of possible reliability problems due to raising temperatures, an electrical connection box housing only the ECU is installed in the interior (passenger space) of the car. This reduces the environmental temperature of the ECU; however, this also increases the entire cost of the car by necessitating the need for additional interior car space of the car for accommodating the electrical connection box.

When an ECU for use in an electronic fuel injection apparatus (EFI) of an engine is installed in the interior of the car, it is necessary to wire a wire harness for connecting the engine and the electronic control unit. In this configuration, the wiring must be done from the inside of the engine compartment to the interior of the car. Therefore, it is necessary to use a long wire harness, which increases cost. It is also necessary to form a wire harness insertion hole on a car body panel partitioning the engine compartment and the interior of the car. This also increases the cost of the car.

JP-U-3-57978 (Utility Model) is one example of a prior art electrical connection box. In JP-U-3-57978 fuses are mounted in apertures of a wall of a sealed housing component of the box. Wires project away from the wall and are covered by a cover which locks onto a housing component.

SUMMARY OF THE INVENTION

It is an object of the present invention to provide an electrical connection box which houses electrical devices susceptible to heat, while ensuring the performance of the electrical devices housed therein.

It is a further object of the present invention to reduce the cost and manufacturing complications of an automotive vehicle in which the electrical connection box is used.

According to one aspect of the present invention, an electrical connection box comprising a base and a peripheral wall upstanding from the base defining an exterior surface of the connection box and an interior space thereof is provided. An interior wall upstanding from the base and located within the interior space sub-divides the interior space into a first compartment and a second compartment. The interior wall is located so that the first compartment is separated from the peripheral wall by an air gap.

At least one electrical element susceptible to heat damage is located in the first compartment. At least one electrical element, which may release heat, is located in the second compartment. The first compartment is closed from the second compartment, thus preventing passage of air from the second compartment to the first compartment. Thus, the electrical element susceptible to heat damage is well isolated from the heat from the heat-releasing element and any other exterior heating source, e.g., an engine of a car.

Preferably the interior wall is located so that the first compartment is separated on at least three sides, and more preferably four sides, from the peripheral wall by the air gap. The air gap is located near the second compartment.

To provide a cooling effect, the electrical connection is provided with a cooling air inlet for admitting cooling air to the second compartment and an air outlet from the second compartment.

For water-tightness, the base is provided with an aperture through which wires pass into the first compartment, a grommet sealing the aperture and a partitioning wall upstanding from the base in the first compartment between the aperture and the electrical element located in the first compartment.

Preferably the electrical connection box has a cover opposed to the base and means sealing the peripheral wall and the interior wall of the body to the cover. Additional protection may be provided by thermal insulation material mounted on at least a face of the interior wall or an interior face of the peripheral wall.

The electrical element susceptible to heat damage installed in the first compartment may be any electronic component. For example the following components are contemplated for use with the present invention:

(i) control unit for an anti-lock braking system;

(ii) control unit for a fuel injection system;

(iii) control unit for a suspension control system; and (iv) a control unit for an ignition control system.

The element which releases heat may be a relay, a fuse and a fusible link.

According to another aspect of the present invention, an electrical connection box comprising bounding walls defining an interior compartment space of the box is provided. At least one first electrical element susceptible to heat damage and at least one second electrical element which releases heat are located in the interior compartment space. The cooling box has a cooling air inlet for admitting cooling air into the interior compartment space and an air outlet from the interior compartment space. The cooling air inlet and air outlet are arranged so that cooling air first cools the first element and thereafter cools the second element.

It should be understood that in use the box may be installed in any appropriate orientation, e.g., with the base arranged vertically.

These and other aspects and salient features of the invention will be described in or apparent from the following detailed description of preferred embodiments.

BRIEF DESCRIPTION OF THE DRAWINGS

The preferred embodiments of the invention will be described in conjunction with the following drawings, in which.

DESCRIPTION OF THE PREFERRED EMBODIMENTS

Figure 1:
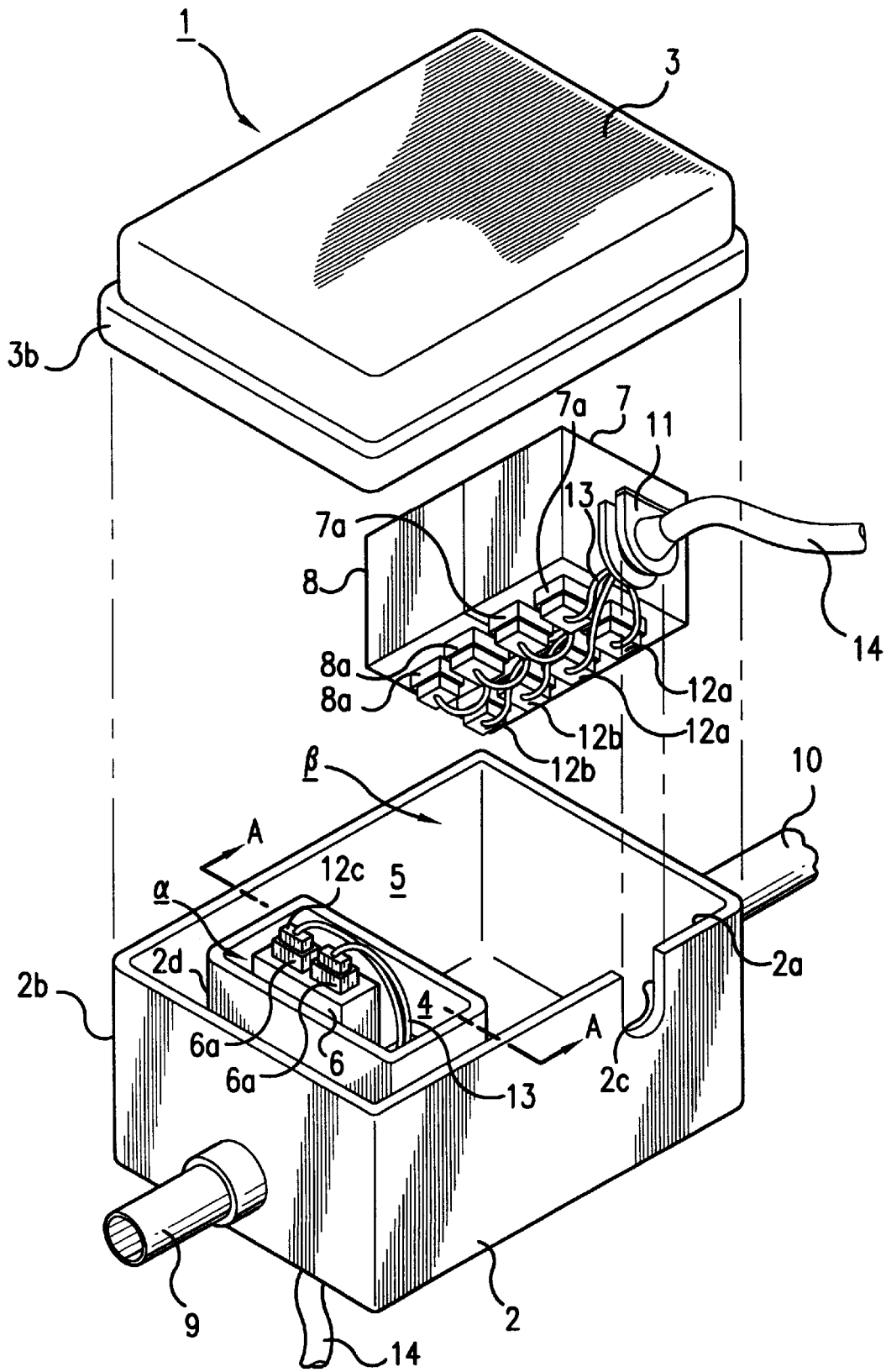
FIG. 1 is an exploded perspective view showing a first electrical connection box embodying the invention.
Figure 2:
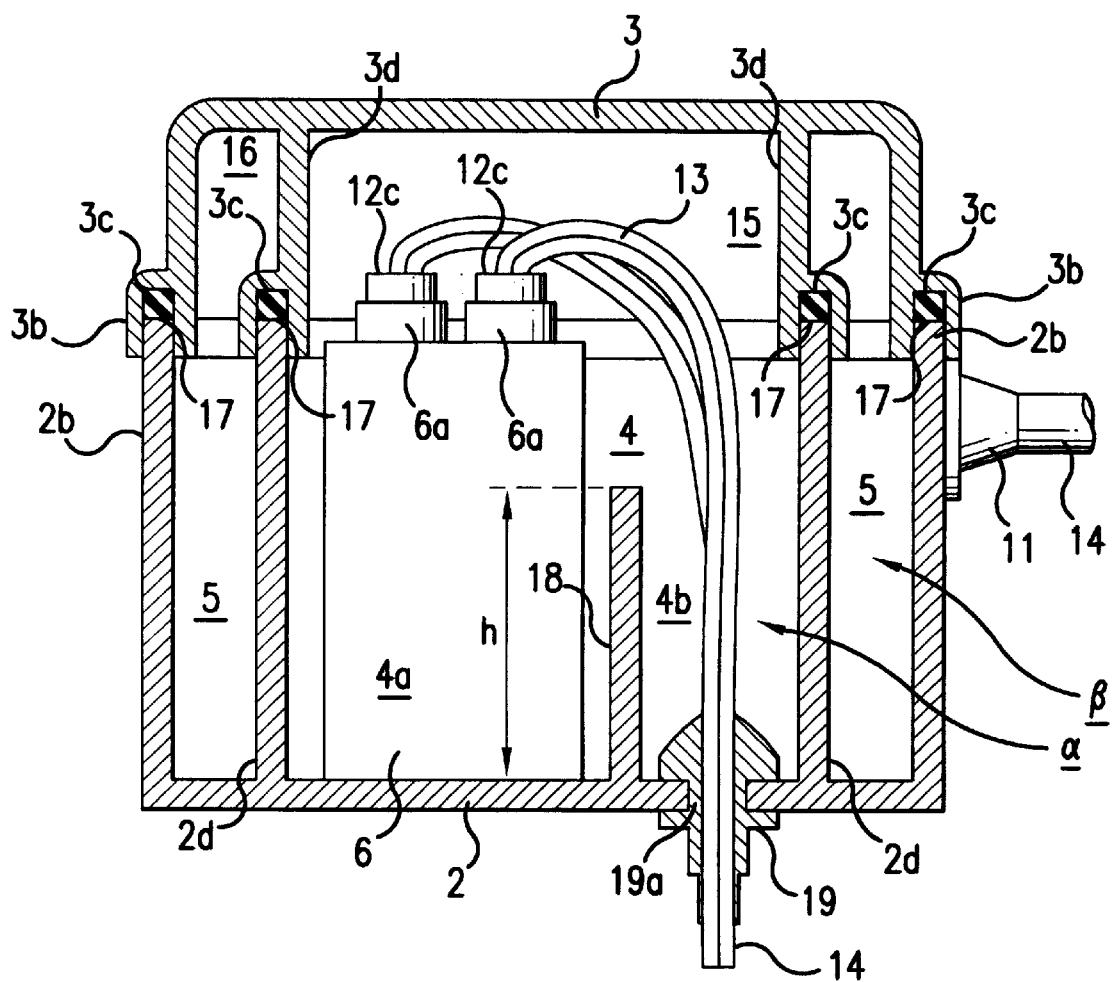
FIG. 2 is a sectional view an line A—A of FIG. 1.
Figure 3:
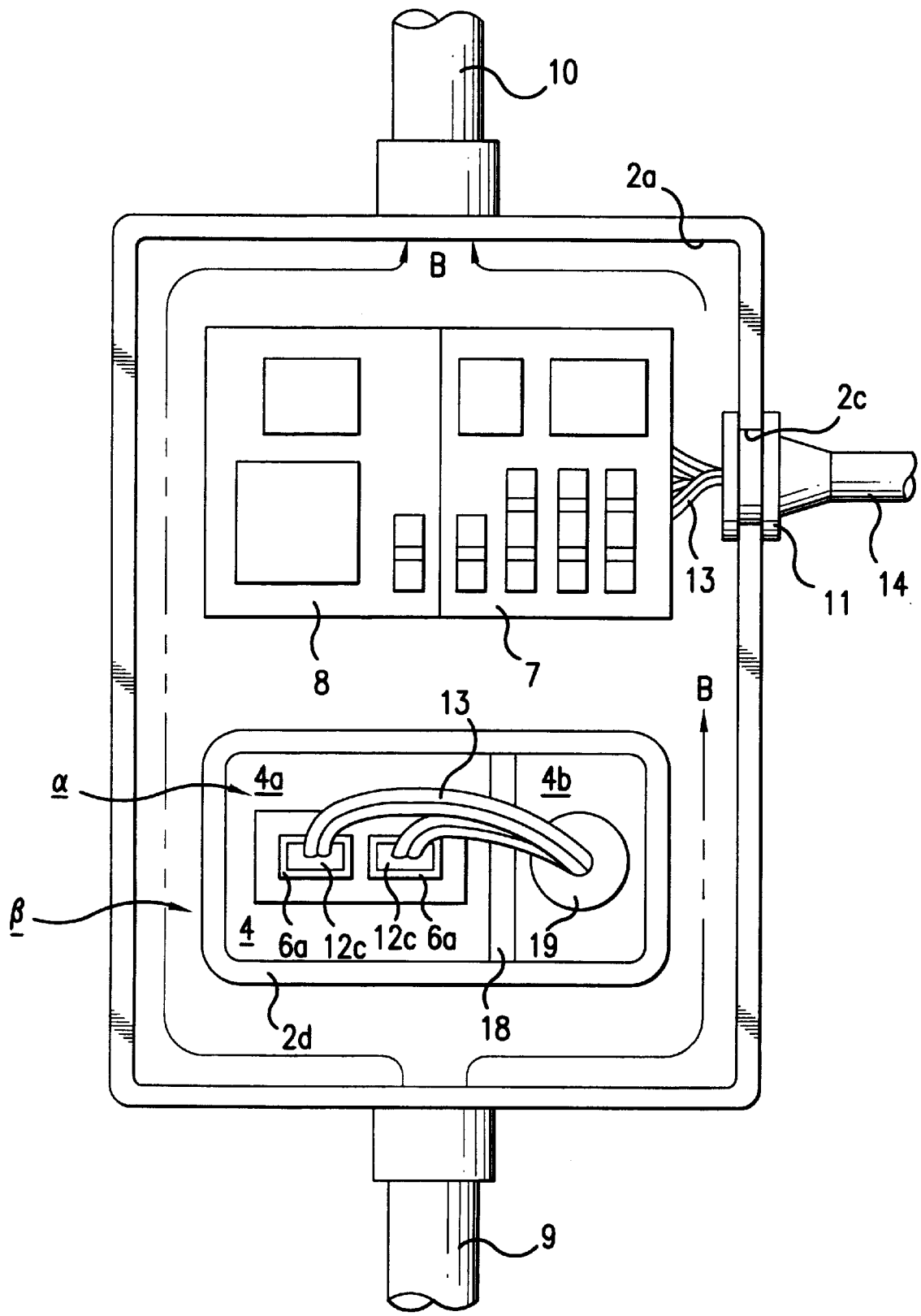
FIG. 3 is a plan view showing the electrical connection box of FIG. 1, with the cover removed.

Referring to FIGS. 1–3, an electrical connection box 1 is shown. In one preferred embodiment the electrical connection box is used in a car. As seen in FIGS. 1–3, the electrical connection box comprises a generally rectangular body 2 and a cover 3 closing the open upper end 2a of the body 2. The body 2 and the cover 3 are both formed of suitable synthetic resin.

The body 2 has a base 2e and an outer peripheral wall 2b. The outer peripheral wall stands up perpendicularly from the base 2e. The interior of the body 2 bounded by the peripheral wall 2b is partitioned into a generally rectangular first compartment 4 surrounded by a partition wall 2d and a second compartment 5 entirely surrounding the first compartment 4. As seen in FIGS. 1–3, the body 2 has a double construction comprising the first and second compartment 4 and 5. In one preferred embodiment the first compartment 4 is separated on all four sides from the peripheral wall 2b by an air gap. On three sides this air gap is narrow. By injection molding, the peripheral wall 2b, the partition wall 2d and the base 2e are formed integrally in one piece of suitable synthetic resin.

In one preferred embodiment the first compartment 4 houses an electronic control unit (ECU) 6 of an anti-lock braking control system (ABS) and an electronic fuel injection apparatus (EFI). The second compartment 5 houses a relay box 7 and a fusible link box 8. Preferably, the relay box 7 houses a relay of an electric circuit of a car and the fusible link box 8 houses a fuse of the electric circuit of the car.

The electronic control unit 6, the relay box 7, and the fusible link box 8 are provided with connection portions 6a, 7a, and 8a, respectively. Connection portion 6a is directed toward the open upper end 2a of the body 2. The connection portions 7a and 8a are directed toward the base of the body 2.

A cooling air intake pipe 9 is installed on the peripheral wall 2b of the body 2 proximate to the partition wall 2d. An air exhaust pipe 10 is installed on the opposite side of the peripheral wall 2b. The air inlet is positioned proximate to the first compartment 4 and the exhaust pipe 10 is positioned proximate to the relay box 7 and fusible link box 8.

A U-shaped notch 2c is formed on the peripheral wall 2b of the body 2 proximate to the boxes 7 and 8. A waterproof grommet 11, preferably made of rubber, is installed in the notch 2c. A locking groove is formed on the periphery of the waterproof grommet 11. The locking groove engages the notch 2c, thus preventing water from penetrating into the second compartment 5 from the gap between the waterproof grommet 11 and the notch 2c.

A wire harness 14 comprising bundled wires 13 having connectors 12a and 12b are inserted through the waterproof grommet 11. The connectors 12a are connected with the connection portions 7a of the relay box 7. The connectors 12b are connected with the connection portions 8a of the fusible link box 8.

FIG. 2 shows the cover 3 installed on the body 2. The interior of the cover 3 comprises a rectangular first compartment portion 15 surrounded by a partition wall 3d and a second compartment portion 16 surrounding the first compartment portion 15. The cover 3 also comprises a peripheral wall 36 which extends downwardly from the top wall 3e. The size and shape of the first and second compartment portions 15 and 16 of the cover 3 correspond to those of the first and second compartments 4 and 5 of the body 2, respectively. In one preferred embodiment the cover is manufactured by injection molding, thereby forming an integral piece.

Grooves 3c, preferably rectangular, are formed along the whole length of the lower end of the peripheral wall 3b and partition wall 3d of the cover 3. A waterproof sealing packing 17, preferably made of an elastic material, is located at the bottom of each groove 3c so that when the cover 3 is installed on the body 2 the peripheral walls 2b and 2d engage the packing 17. This prevents water from penetrating into the first and second compartments 4 and 5 and into the first and second compartment portions 15 and 16 through the gap between the body 2 and the cover 3. The first and second compartment portions 15 and 16 are preferably fully sealed from each other.

The interior of the first compartment 4 is partitioned by a partitioning wall 18. The partitioning wall is preferably a predetermined height (h) less than the height of the wall 2d, into a part 4a in which the electronic control unit 6 is housed and a part 4b at which a waterproof grommet 19 (preferably made of rubber) is installed. A locking groove 19a is formed on the periphery of the waterproof grommet 19 and engages a through-hole 4c formed in the base wall 2e. This prevents water from penetrating into the first compartment 4 via the gap between the waterproof grommet 19 and the through-hole 4c. A wire harness 14 comprising bundled wires 13 is inserted through the waterproof grommet 19. The bundled wires 13 each have a connector 12c at the end. The connectors 12c are connected with connection portions 6a of the electronic control unit 6.

Figure 4:
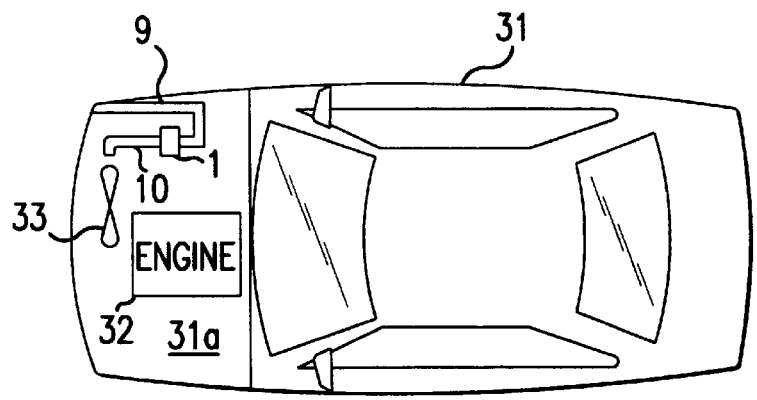
FIG. 4 is a diagrammatic illustration showing the electrical connection box of FIG. 1 installed in a car.

FIG. 4 shows the installation position of the electrical connection box 1 in a car 31. An engine 32 is installed in an engine compartment 31a of the car 31. The electrical connection box 1 is installed inside the engine compartment 31a with the cover 3 positioned at the top and the base 2e of the body 2 at bottom. However, the box 1 may be installed at any orientation in the engine compartment. The end of the intake pipe 9 is open to the atmosphere at the outside of the car 31. The end of the exhaust pipe 10 is open proximate to a radiator fan 33 of the engine.

OPERATION OF ELECTRICAL CONNECTION BOX

The relay housed in the relay box 7 and the fuse housed in the fusible link box 8 are heat-releasing devices. Because the electronic control unit 6 has an electronic circuit, there is a possibility that the characteristics of the electronic circuit may change due to the rising environmental temperature of the electronic control unit 6. The temperature may cause deterioration of the electronic components.

The reliability of the electronics increases because the relay box 7 and the fusible link box 8 are housed in the compartment 5 and the electronic control unit 6 is housed in the compartment 4, which is separated by an air gap on all four sides from the peripheral wall 26. Thus, the heating effect of the relay box 7 and fusible link box 8 is reduced. Accordingly, it is unnecessary to use heat resistant electronic parts to improve the heat-resistance of the electronic control unit 6. Further, because the electronic control unit 6, the relay box 7 and the fusible link box 8 are housed in one electrical connection box 1, it costs less than that of separate electrical connection boxes dedicated to the these electronic components. Valuable space is also saved in the engine compartment 31a as well as the interior of the car 31.

When the engine 32 of the car 31 starts and the radiator fan 33 rotates, a negative pressure is generated inside the engine compartment 31a, at least adjacent the end of the pipe 10. As a result, the air inside the electrical connection box 1 is exhausted to the engine compartment 31a through the exhaust pipe 10. Consequently, cool air from outside the car 31 flows into the second compartment portion 5 through the intake pipe 9. Accordingly, the air outside the car 31 is constantly introduced into the electrical connection box 1 through a path shown by the arrow 3 of FIG. 3.

Because the intake pipe 9 is positioned proximate to the first compartment 4, the electronic control unit 6 is cooled by the cool air which has been just introduced into box 1. Since the exhaust pipe 10 is positioned proximate to the relay box 7 and the fusible link box 8, the air that has cooled the relay box 7 and the fusible link box 8 does not flow backward toward the electronic control unit 6. Accordingly, the electronic control unit 6 which is susceptible to heat is efficiently cooled.

When the cover 3 is installed on the body 2, the sealing packing 17 is sandwiched between the peripheral wall 2b of the body 2 and the groove 3c on the peripheral wall 3b of the cover 3. The wire harness 14 connected with the relay box 7 and the fusible link box 8 is inserted into the waterproof grommet 11. Accordingly, the penetration of water into the electrical connection box 1 is prevented. Therefore, risk of loss of the reliability of the relay box 7 and the fusible link box 8 is diminished.

The sealing packing 17 is sandwiched between the partition wall 2d of the body 2 and the groove 3c formed on the partition wall 3d of the cover 3. Further, the wire harness 14 connected with the electronic control unit 6 is inserted into the waterproof grommet 19. Thus, the penetration of water into the first compartment 4 is also prevented.

In one preferred embodiment, the first compartment 4 has a higher degree of waterproofness than the second compartment 5 because of the sealing packings 17 provided between the peripheral walls 2b and 3b and between the partitioning walls 2d and 3d.

The partition wall 18 partitions the first compartment 4 into two parts 4a and 4b. Thus, even when the degree of the waterproofness of the waterproof grommet 19 has decreased and water has penetrated into the part 4b via a gap between the waterproof grommet 19 and the through-hole 4C, the partition wall 18 reduces the risk of the water from reaching the electronic control unit 6. Further, because the waterproof grommet 19 is installed in the base 2e of the body 2, water which has penetrated into the part 4b can easily pass to the outside via the gap between the waterproof grommet 19 and the through-hole 4c. Accordingly, even though water may penetrate into the engine compartment 31a, the above-described construction prevents the penetration of water into the electronic control unit 6.

Because the electronic control unit 6 has an electronic circuit, its reliability may be deteriorated by exposure to water more quickly than that of the relay box 7 and fusible link box 8. Thus, in this embodiment, the electronic control unit 6 is very well protected from being exposed to water.

Figure 5:
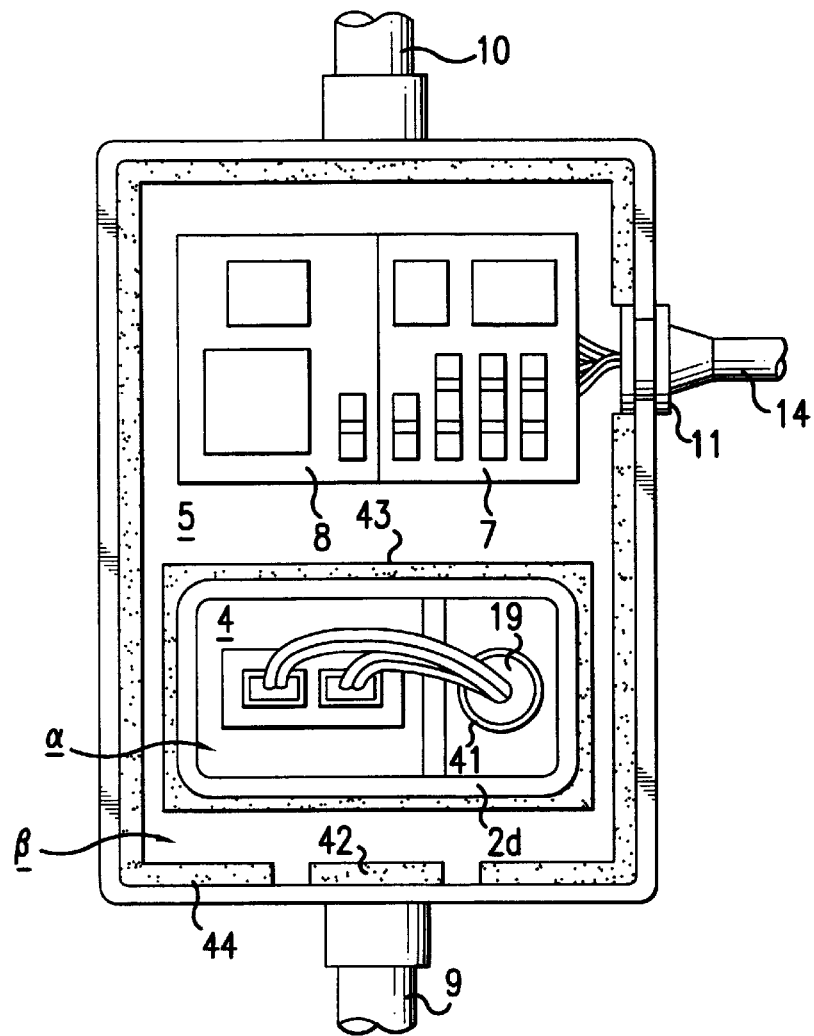
FIG. 5 is plan view (with its cover removed) of a second electrical connection box embodying the present invention.

In another embodiment of the present invention, the partition wall 18 (FIG. 3) may be replaced by a cylinder 41 surrounding the waterproof grommet 19, as shown in FIG. 5. In this case, the height of the cylinder 41 is equal to the height (h) of the partition wall 18.

As shown in FIG. 5, a filter member 42 made of a porous material having air permeability and moisture-absorption property is installed at the connection of the intake pipe 9 and the body 2. The filter member 42 removes water and dust from the air which flows into the box 1 via the intake pipe 9. The filter member 42 keeps the inside of the box 1 clean, thus preventing the connection portions 6a, 7a and 8a from being exposed to dust which deteriorates the dielectric strength.

As shown in FIG. 5, a layer of heat-insulating material 43 is bonded to the outer surface of the partition wall 2d of the body 2. The heat-insulating material 43 reduces heat transmission from inside the engine compartment 31a to the electronic control unit 6 through the partition wall 2d. A layer of heat-insulating material 44 is bonded to the inner surface of the peripheral wall 2b of the body 2. The heat-insulating material 44 also reduces heat transmission from inside the engine compartment 31a to the electronic control unit 6 through the peripheral wall 2b.

Other components such as a junction box connected with electric wires which are branched from a wire harness and wired on a car body may be housed inside the second compartment 4.

The waterproof grommet 11 may also be installed in the base 2e of the body 2. In this construction, even if the waterproof grommet 11 allows water to enter into the box 1, water can easily discharge to the outside via the gap between the waterproof grommet 11 and the body 2.

In alternative embodiments, the partition wall 2d may join into the peripheral wall 2b so that the first compartment 4 is separated from the peripheral wall 2b by an air gap on only three sides (or only two sides).

Preferred and alternate embodiments of the present invention have now been described in detail. It is to be noted, however, that the description of these specific embodiments is merely illustrative of the principles underlying the inventive concept. It is therefore contemplated that various modifications of the disclosed embodiment will, without departing from the spirit and scope of the invention, be apparent to persons of ordinary skill in the art.

What is claimed is:

1. An electrical connection box, comprising:
    a base;
    a peripheral wall upstanding from the base defining an exterior surface of said electrical connection box and an interior space;
    an interior wall upstanding from said base and located within said interior space, and sub-dividing said interior space into a first compartment and a second compartment, said interior wall being located so that said first compartment is, on at least two sides thereof, separated from said peripheral wall by an air gap, said interior wall being integral with said base;
    an aperture, through which wires pass into said first compartment being formed in said base;
    a grommet that seals said aperture;
    at least one heat sensitive element located in one of said first compartment and said second compartment, the at least one heat sensitive element being susceptible to heat damage;

at least one heat generating element located in the other one of said first compartment and said second compartment, the at least one heat generating element releasing heat when in use; and a partitioning wall upstanding from said base in said first compartment located between said aperture and said at least one heat sensitive element or said at least one heat sensitive element, that is located in said first compartment;

wherein said first compartment is closed from said second compartment so as to prevent passage of air from said second compartment into said first compartment.

2. An electrical connection box of claim 1, wherein said interior wall is located so that said first compartment is separated on at least three sides from said peripheral wall by said air gap.

3. An electrical connection box of claim 1, wherein said interior wall is located so that said first compartment is separated on four sides from said peripheral wall by said air gap.

4. An electrical connection box of claim 1, wherein said air gap is in fluid communication with said second compartment.

5. An electrical connection box of claim 1, further comprising:
a cooling air inlet for admitting cooling air to said second compartment; and
an air outlet extending from said second compartment.

6. An electrical connection box of claim 1, wherein said base, said peripheral wall and said interior wall are molded from resin material.

7. An electrical connection box of claim 1, further comprising:
a cover opposed to said base; and
a sealer for sealing said peripheral wall and said interior wall to said cover.

8. An electrical connection box of claim 1, further comprising thermal insulation material mounted on at least one of a face of said interior wall and an interior face of said peripheral wall.

9. An electrical connection box, comprising:
a base;
a peripheral wall upstanding from the base defining an exterior surface of said electrical connection box and an interior space;
an interior wall upstanding from said base and located within said interior space, and sub-dividing said interior space into a first compartment and a second compartment, said interior wall being located so that said first compartment is, on at least two sides thereof, separated from said peripheral wall by an air gap, said interior wall being integral with said base;
at least one heat sensitive element located in one of said first compartment and said second compartment, the at least one heat sensitive element being susceptible to heat damage; and
at least one heat generating element located in the other one of said first compartment and said second compartment the at least one heat generating element releasing heat when in use;
wherein said first compartment is closed from said second compartment so as to prevent passage of air from said second compartment into said first compartment, and
wherein the electrical connection box is installed in an automotive vehicle engine compartment.

10. An electrical connection box of claim 9, wherein said heat sensitive element located in one of said first compartment and said second compartment is a circuit comprising electronic components selected from the group consisting of (i) a control unit for an anti-lock braking system, (ii) a control unit for a fuel injection system, (iii) a control unit for a suspension control system, and (iv) a control unit for an ignition control system.

11. An electrical connection box of claim 10, wherein said at least one heat generating element located in the other of said first compartment and said second compartment is selected from the group consisting of a relay, a fuse and a fusible link.

12. An automotive vehicle having an engine compartment, an engine mounted in said engine compartment and an electrical connection box mounted in said engine compartment, said electrical connection box comprising:
a base;
a peripheral wall upstanding from the base defining an exterior surface of said electrical connection box and an interior space;
an interior wall upstanding from said base and located within said interior space, and sub-dividing said interior space into a first compartment and a second compartment, said interior wall being located so that said first compartment is, on at least two sides thereof, separated from said peripheral wall by an air gap, said interior wall being integral with said base;
at least one heat sensitive element located in one of said first compartment and said second compartment, the at least one heat sensitive element being susceptible to heat damage; and
at least one heat generating element located in the other one of said first compartment and said second compartment, the at least one heat generating element releasing heat when in use;
wherein said first compartment is closed from said second compartment so as to prevent passage of air from said second compartment into said first compartment.

13. An automotive vehicle having an engine compartment, an engine mounted in said engine compartment and an electrical connection box mounted in said engine compartment, the electrical connection box comprising:
a plurality of bounding walls defining an interior space of said box;
a least one first electrical element located in said interior space;
at least one second electrical element which in use releases heat and which is located in said interior space, the first electrical element being susceptible to damage from heat released by the at least one second electrical element during normal operation of the at least one second electrical element;
a cooling air inlet that admits cooling air into said interior space; and
an air outlet extending from said interior space, said cooling air inlet and air outlet being arranged so that cooling air admitted first cools said at least one first element and then cools said at least one second element.

14. The automotive vehicle as set forth in claim 13, wherein the at least one first electrical element is located within a compartment defined within said interior space, and the at least one second electrical element is located outside the compartment.

* * * * *